US008659332B2

(12) United States Patent
Tso et al.

(10) Patent No.: US 8,659,332 B2
(45) Date of Patent: Feb. 25, 2014

(54) SIGNAL CIRCUIT

(75) Inventors: Ko-Yang Tso, New Taipei (TW);
Hui-Wen Miao, Hsinchu (TW);
Yann-Hsiung Liang, Hsinchu (TW);
Chin-Chieh Chao, Hsinchu (TW);
Ren-Feng Huang, Kaohsiung (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 143 days.

(21) Appl. No.: 13/343,572

(22) Filed: Jan. 4, 2012

(65) Prior Publication Data

US 2012/0176168 A1 Jul. 12, 2012

(30) Foreign Application Priority Data

Jan. 6, 2011 (TW) .............................. 100100525 A

(51) Int. Cl.
*H03L 7/06* (2006.01)
*H03L 7/00* (2006.01)

(52) U.S. Cl.
USPC ............................ 327/146; 327/141; 327/144

(58) Field of Classification Search
USPC .......................................... 327/146, 144, 141
See application file for complete search history.

(56) References Cited

U.S. PATENT DOCUMENTS

| 6,570,944 | B2 * | 5/2003 | Best et al. ...................... 375/355 |
| 7,292,662 | B2 * | 11/2007 | Gregorius ...................... 375/350 |
| 7,457,391 | B2 * | 11/2008 | Gregorius et al. ............. 375/373 |
| 7,861,105 | B2 * | 12/2010 | Ke et al. .......................... 713/401 |
| 8,180,007 | B2 * | 5/2012 | Iqbal et al. ..................... 375/355 |
| 8,355,480 | B2 * | 1/2013 | Best et al. ...................... 375/355 |
| 2004/0161070 | A1 * | 8/2004 | Yin et al. ....................... 375/371 |
| 2006/0262891 | A1 * | 11/2006 | Faulkner ........................ 375/371 |
| 2008/0304599 | A1 * | 12/2008 | Furtner ......................... 375/340 |
| 2008/0320324 | A1 * | 12/2008 | Ke et al. ......................... 713/401 |
| 2011/0170644 | A1 * | 7/2011 | Iqbal et al. ..................... 375/355 |
| 2012/0176168 | A1 * | 7/2012 | Tso et al. ........................ 327/145 |
| 2012/0269308 | A1 * | 10/2012 | Huang et al. .................. 375/355 |
| 2013/0107987 | A1 * | 5/2013 | Park et al. ...................... 375/316 |
| 2013/0120036 | A1 * | 5/2013 | Zhu et al. ....................... 327/156 |

\* cited by examiner

*Primary Examiner* — Ryan Jager

(57) ABSTRACT

A signal circuit includes a clock terminal for transmitting a reference clock and a data terminal for transmitting an input/output data. In an embodiment, the frequency of the reference clock is one-eighth of the bit rate of the input/output data.

7 Claims, 3 Drawing Sheets

SIGNAL CIRCUIT

This application claims the benefit of Taiwan Patent Application No. 100100525, filed Jan. 6, 2011, the subject matter of which is incorporated herein by reference.

FIELD OF THE INVENTION

The present invention relates to a signal circuit, and more particularly to a signal circuit for transmitting an input/output data according to a low frequency reference clock and at a high bit rate.

BACKGROUND OF THE INVENTION

A variety of signal circuits for storing, controlling, processing and/or driving electronic signals are widely used as important hardware components in the modern information societies. For example, the signal circuit may be included in a chip/die and packaged into an integrated circuit. In addition, the signal circuits with different functions may be further integrated into an electronic system.

In the electronic system, different signal circuits may be coordinately operated to exchange data. During the process of exchanging data by the signal circuits, the signal circuit which issues the data may also provide a corresponding reference clock. According to the reference clock, the signal circuit which receives the data will successively acquire all bits of the data.

SUMMARY OF THE INVENTION

In the current computing technology, the frequency of the reference clock is equal to the bit rate of the data or equal to a half of the bit rate. As the demand on the computing speed is gradually increased, the bit rate of the signal circuit for exchanging data becomes faster and faster. Moreover, in the current computing technology, the reference clock is a high frequency clock. As known, the high frequency clock may increase the power consumption of the electronic system and increase the electromagnetic interference.

An embodiment of the present invention provides a signal circuit. The signal circuit includes a data terminal and a clock terminal for transmitting (issuing or receiving) an input/output data and a corresponding reference clock, respectively. The frequency of the reference clock is lower than a half of a bit rate of the input/output data. For example, the frequency (cycles per unit time) of the reference clock is substantially equal to 1/M times the bit rate (bits per unit time) of the input/output data, wherein M is greater than 2, for example M is equal to 8.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
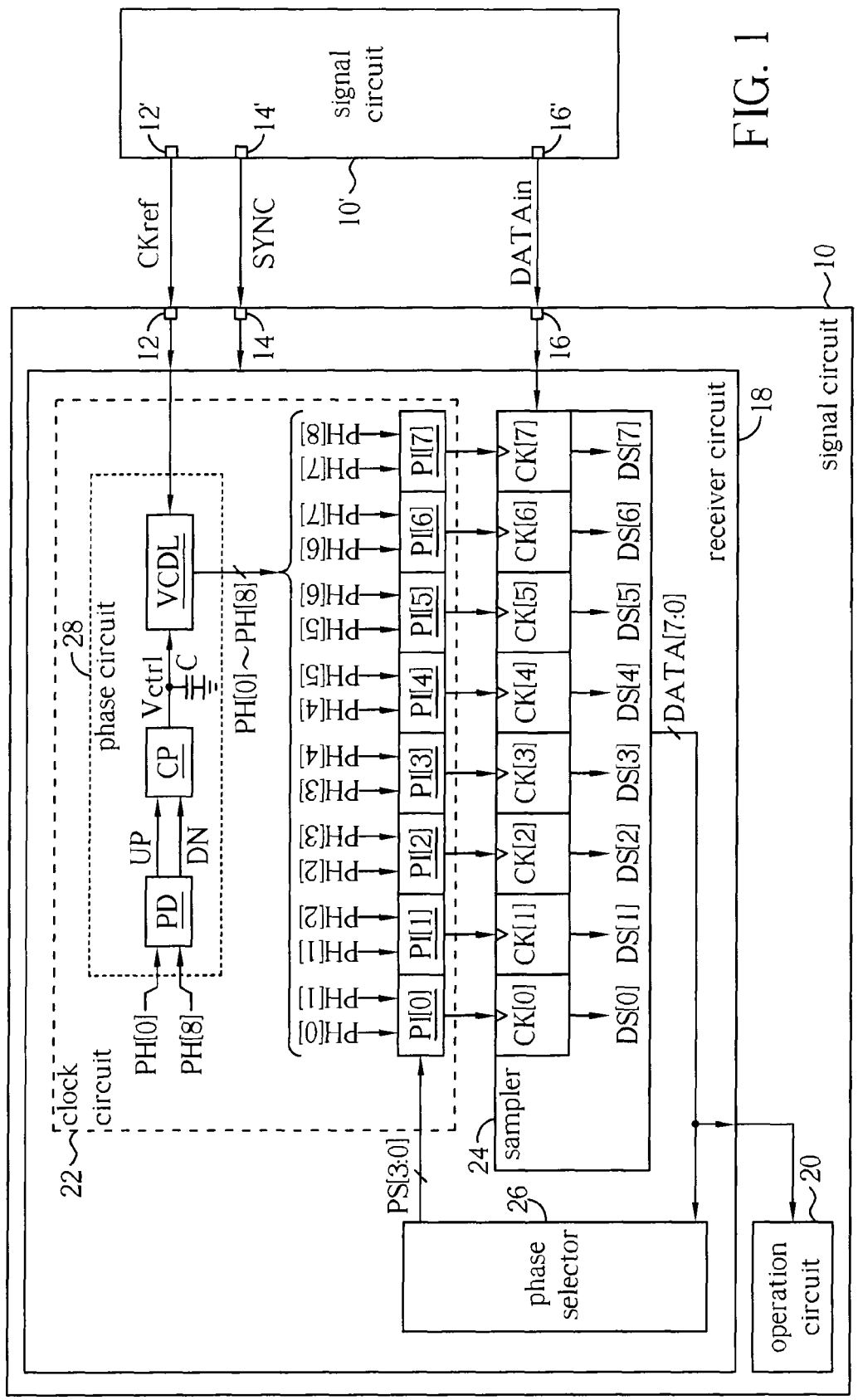
FIG. 1 is a schematic circuit diagram illustrating two signal circuits according to an embodiment of the present invention.

FIG. 1 is a schematic circuit diagram illustrating two signal circuits 10 and 10' according to an embodiment of the present invention. As shown in FIG. 1, the signal circuit 10' has a clock terminal 12', a synchronizing signal terminal 14' and a data terminal 16' for issuing a reference clock CKref, a synchronizing signal SYNC and an input/output data DATAin, respectively. The reference clock CKref corresponds to the input/output data DATAin. In addition, the frequency of the reference clock CKref is lower than a half of a bit rate of the input/output data DATAin. For example, in an embodiment, the frequency (cycles per unit time) of the reference clock CKref is 1/M times the bit rate (bits per unit time) of the input/output data DATAin. For example, M is 8.

Corresponding to the clock terminal 12', the synchronizing signal terminal 14' and the data terminal 16' of the signal circuit 10', the signal circuit 10 has a clock terminal 12, a synchronizing signal terminal 14 and a data terminal 16. The reference clock CKref, the synchronizing signal SYNC and the input/output data DATAin are received by the clock terminal 12, the synchronizing signal terminal 14 and the data terminal 16, respectively. As shown in FIG. 1, the signal circuit 10 comprises a receiver circuit 18 and an operation circuit 20. According to the reference clock CKref and the input/output data DATAin, an M-bit parallel data DATA is provided by the receiver circuit 18. In this embodiment, the M-bit parallel data DATA is an eight-bit parallel data (i.e. M=8) and denoted as DATA[7:0] (see FIG. 1). The operation circuit 20 will perform associated processing and operating tasks according to the M-bit parallel data DATA.

Please refer to FIG. 1 again. The receiver circuit 18 comprises a clock circuit 22, a sampler 24 and a phase selector 26. The clock circuit 22 is connected with the clock terminal 12. According to the reference clock CKref, M sampling clocks CK[0]~CK[M−1] (e.g. CK[0]~CK[7] in the embodiment of FIG. 1) are provided by the clock circuit 22. The frequency of each sampling clock CK[m] is equal to the frequency of the reference clock CKref, wherein m=0~(M−1). Moreover, the phases of these sampling clocks are different. For example, a phase difference between the sampling clock CK[m] and the sampling clock CK[0] is equal to 360×(m/M) degrees.

The sampler 24 is connected with the data terminal 16 and the clock circuit 22. According to the sampling clocks CK[0]~CK[M−1], the input/output data DATAin is sampled by the sampler 24, so that M sampling data DS[0]~DS[M−1] (e.g. DS[0]~DS[7] in the embodiment of FIG. 1) are acquired. In such way, the bit rate of each sampling data is substantially equal to the frequency of each sampling clock. These M sampling data are collaboratively defined as the M-bit parallel data DATA.

The phase selector 26 is used for providing a phase select signal PS. For example, the phase select signal PS is a four-bit binary number, which is denoted as PS[3:0] (see FIG. 1). The four-bit binary number may be converted into a decimal number in the range from 0 to 15.

Please refer to FIG. 1 again. The clock circuit 22 comprises a phase circuit 28 and M phase interpolators PI[0]~PI[M−1] (e.g. PI[0]~PI[7] in the embodiment of FIG. 1). According to the reference clock CKref, a plurality of phase signals PH[0]

~PH[M] (e.g. PH[0]~PH[8] in the embodiment of FIG. 1) are provided by the clock circuit 22. The frequency of each of the phase signals PH[0]~PH[M] is equal to the frequency of the reference clock, and the phases of the phase signals PH[0]~PH[M] are different. For example, a phase difference between the phase signal PH[m] and the phase signal PH[0] is equal to 360×(m/M) degrees.

Please refer to FIG. 1 again. The phase circuit 28 comprises a phase detector PD, a charge pump Cp, a capacitor C, and a voltage-controlled delay line VCDL. By comparing the phase difference between the phase signals PH[0] and PH[M] (PH[8]), an error signal (UP or DN) is provided by the phase detector PD. The charge pump Cp is connected between the phase detector PD and the capacitor C. According to the error signal (UP or DN), the charge pump Cp generates a control voltage Vctrl to the capacitor C. The voltage-controlled delay line VCDL is connected with the capacitor C and the clock terminal 12. According to the reference clock CKref and the control voltage Vctrl, the voltage-controlled delay line VCDL generates various phase signals PH[0]~PH[M], wherein the cycle of each of the phase signals PH[0]~PH[M] is equal to the cycle of the reference clock CKref. Consequently, the phase difference between the phase signals PH[m] and PH[m+1] with any two adjacent subscripts is identical, wherein m=0~(M-1). In a case that the phase of the phase signal PH[M] is ahead or behind the phase of the phase signal PH[0], the phase detector PD will generate an error signal UP or DN. According to the error signal, the capacitor C is discharged by the charge pump CP, so that the control voltage Vctrl is changed. Correspondingly, the phase difference between the adjacent phase signals PH[m] and PH[m+1] is increased or decreased by the voltage-controlled delay line VCDL. The phase detection of the phase detector PD and the phase difference adjustment are repeatedly performed until the phase of the phase signal PH[0] is substantially equal to the phase of the PH[M]. Under this circumstance, the phase differences between the phase signals PH[0]~PH[M-1] will be evenly distributed in 360 degrees. That is, the phase difference between the phase signal PH[m] and the phase signal PH[0] is equal to 360×(m/M) degrees.

In the M phase interpolators PI[0]~PI[M-1], two corresponding phase signals PH[m] and PH[m+1] are received by the m-th phase interpolator PI[m]. According to the phase select signal PS, the m-th phase interpolator PI[m] performs a phase interpolation on the two phase signals PH[m] and PH[m+1], thereby generating the sampling clock CK[m]. The frequency of the sampling clock CK[m] is equal to the frequency of each phase signal PH[m]. Due to the phase interpolation of the phase interpolator PI[m], the phase of the sampling clock CK[m] lies in the phase range between the phase signals PH[m] and PH[m+1]. For example, the phase difference between the sampling clock CK[m] and the phase signal PH[m] may be equal to (360/M)×(PS/16) degrees, wherein PS is the value of the phase select signal PS.

Figure 2:
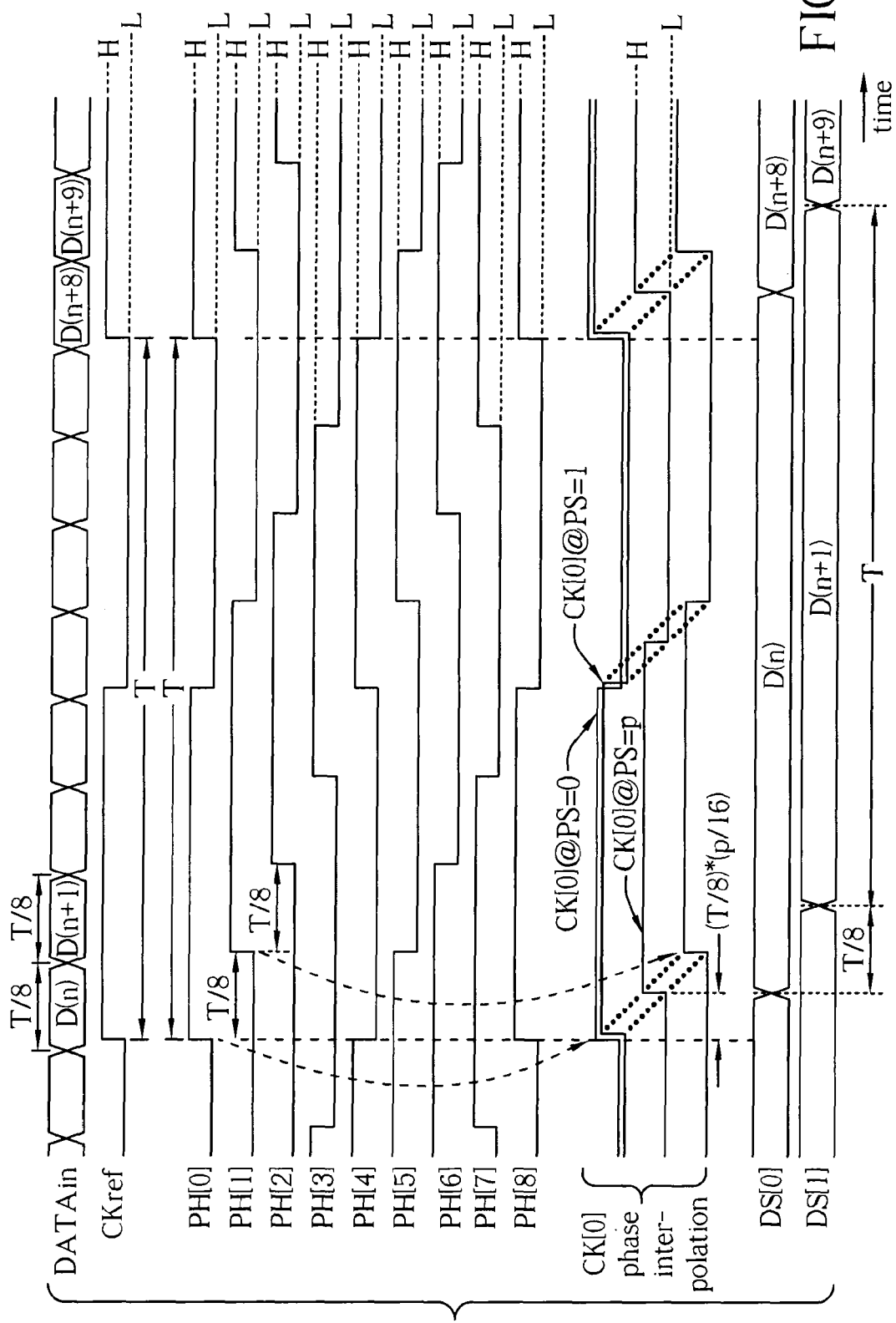
FIG. 2 is a schematic timing waveform diagram illustrating associated signal processed in the signal circuit of FIG. 1.

FIG. 2 is a schematic timing waveform diagram illustrating associated signal processed in the signal circuit of FIG. 1. As shown in FIG. 2, the reference clock CKref includes alternate high level H and low level L in every cycle T. For example, in every cycle T, the reference clock CKref is maintained at the high level H for a half of the cycle (T/2) and maintained at the low level L for another half of the cycle (T/2). In addition, each bit (e.g. the bit D(n), D(n+1), . . . , and so on) of the input/output data DATAin is processed for a time period of one-eighth of a cycle T (i.e. T/8). That is, the bit rate of the input/output data DATAin is eight times the frequency of the reference clock CKref. Although the frequency of the reference clock CKref is much lower than the bit rate of the input/output data DATAin, the signal circuit is still capable of acquiring each bit of the input/output data DATAin according to the reference clock CKref. The operations will be illustrated in more details as follows.

From the above discussions, the phase circuit 28 may generate the phase signals PH[0]~PH[8] according to the reference clock CKref. Each of the phase signals PH[0]~PH[8] is periodically generated in every cycle T. The phase difference between the phase signal PH[m] and the phase signal PH[m+1] is equal to (360/8) degrees, which is equivalent to a time difference of T/8 in the time axis. According to the phase select signal PS, the phase interpolator PI[m] performs a phase interpolation on the two phase signals PH[m] and PH[m+1], thereby generating the sampling clock CK[m]. For example, as shown in FIG. 2, the sampling clock CK[0] is obtained by performing the phase interpolation on the phase signals PH[0] and PH[1]. As the value of the phase select signal PS is gradually increased, the phase of the sampling clock CK[0] is gradually changed from the phase of the phase signal PH[0] to the phase of the phase signal PH[1]. For example, if the value of the phase select signal PS is 0, the phase of the sampling clock CK[0] (e.g. CK[0]@PS=0 as shown in FIG. 2) is close to the phase of the phase signal PH[0]. Whereas, if the value of the phase select signal PS is 1, the phase of the sampling clock CK[0] (e.g. CK[0]@PS=1) is slightly distant from the phase of the phase signal PH[0]. Whereas, if the value of the phase select signal PS is p, the phase difference between the sampling clock CK[0] (e.g. CK[0]@PS=p) and the phase signal PH[0] is equal to (360/8)×(p/16) degrees. That is, the time difference in the time axis is equal to (T/8)×(p/16).

In other words, the phase of the phase signal PH[m] may be fine-tuned within a phase range of (360/8) by the phase interpolator PI[m]. The fine-tuning result is the sampling clock CK[m]. Moreover, the phase interpolations may be performed by the phase interpolators PI[0]~PI[7] according to the same phase select signal PS. Consequently, the phase difference between the sampling clocks CK[m] and CK[m+1] is identical to the phase difference between the phase signals PH[m] and PH[m+1].

According to the sampling clocks CK[0]~CK[7], the input/output data DATAin is sampled by the sampler 24, so that M sampling data DS[0]~DS[7] are acquired. For example, once the sampling clock CK[m] is switched from the low level L to the high level H, the input/output data DATAin is sampled by the sampler 24, so that a bit of the sampling data DS[m] is acquired. In FIG. 2, the sampling data DS[0] and DS[1] are shown and illustrated. Since the cycle T of the sampling clock CK[0] is eight times the cycle of each bit of the input/output data DATAin, the bits D(n) and D(n+8) of the input/output data DATAin are sampled into two adjacent bits of the sampling data DS[0] according to the sampling clock CK[0]. As shown in FIG. 2, each bit of the sampling data DS[0] is processed for a time period of the cycle T. Similarly, according to the sampling clock CK[1] which is behind the sampling clock CK[0] by T/8, the bits D(n+1) and D(n+9) of the input/output data DATAin which are next to the bits D(n) and D(n+8) are repectively sampled into two adjacent bits of the sampling data DS[1]. The rest may be deduced by analogy. That is, the bit D(n+q) of the input/output data DATAin is sampled into the sampling data DS[r], wherein r is the remainder of q divided by 8.

Moreover, by a suitable locking mechanism, the sampler 24 may align the bits of the sampling data DS[0]~DS[7] with each other, thereby generating an eight-bit parallel data DATA. In other words, even if the bit rate of the input/output data DATAin is eight times the frequency of the reference clock CKref, the receiver circuit 18 is capable of completely acquiring all bits of the input/output data DATAin and converting the input/output data DATAin into the parallel data DATA with a lower bit rate (i.e. one-eighth of the bit rate of the input/output data DATAin). Since the clock, signal and data are received and processed by the signal circuit 10 at a low frequency and a low bit rate, both of the receiver circuit 18 and the operation circuit 20 of the signal circuit 10 can be operated at the low frequency. In such way, the power consumption of the signal circuit 10 is effectively reduced and the demand on the bandwidth of the signal circuit 10 is not stringent.

Moreover, since the signal circuit 10' only needs to provide a low-frequency reference clock CKref rather than a high-frequency reference clock, the power consumption of the signal circuit 10' is also reduced. Moreover, during the low-frequency operation of the signal circuit 10, it is not necessary to use a frequency divider to convert the high-frequency reference clock into the low-frequency clock. According to the low-frequency reference clock CKref provided by the signal circuit 10', the signal circuit 10 is capable of directly generating various sampling clocks CK[0]~CK[7]. In such way, the circuitry complexity, layout area and power consumption of the signal circuit 10 may be further reduced.

The signal circuits 10' and 10 may be implemented by different chips. These two signal circuits 10' and 10 are in communication with each other to transmit the reference clock CKref through the traces of the circuit boards. Moreover, since it is not necessary to transmit the high-frequency reference clock CKref through the two signal circuits 10' and 10, the electromagnetic interference resulting from the high-frequency clock will be effectively reduced, the limitation of designing the trace of the circuit board will be reduced, and the flexibility of the trace arrangement will be enhanced.

From the above discussions in FIGS. 1 and 2, the sampling action of the input/output data DATAin is triggered by the sampler 24 according to the signal switching action of the sampling clocks CK[0]~CK[7] (e.g. the action of switching each sampling clock from the low level L to the high level H). The timing of the signal switching action and the phases of the sampling clocks CK[0]~CK[7] are controlled according to the phase select signal provided by the phase selector 26. For accurately sampling all bits of the input/output data DATAin, the timing for triggering the signal switching action of the sampling clock and the timing for triggering the signal switching action of a corresponding bit of the input/output data DATAin will have a specified phase relationship. As a consequence, during the sampling process is performed, the set-up time and the hold time are sufficient.

For adjusting the phase relation between the sampling clocks and the input/output data DATAin, the input/output data DATAin may contain not only the content data but also a training code. The training code is a bit series in a predetermined mode. According to the known training code in the predetermined mode, the value of the phase select signal PS is tested and optimized by the phase selector 26. Then, the phases of various sampling clocks are controlled according to the optimized phase select signal PS, and the subsequent content data of the input/output data DATAin is sampled. In addition, the synchronizing signal SYNC may be employed to indicate the training code of the input/output data DATAin.

Figure 3:
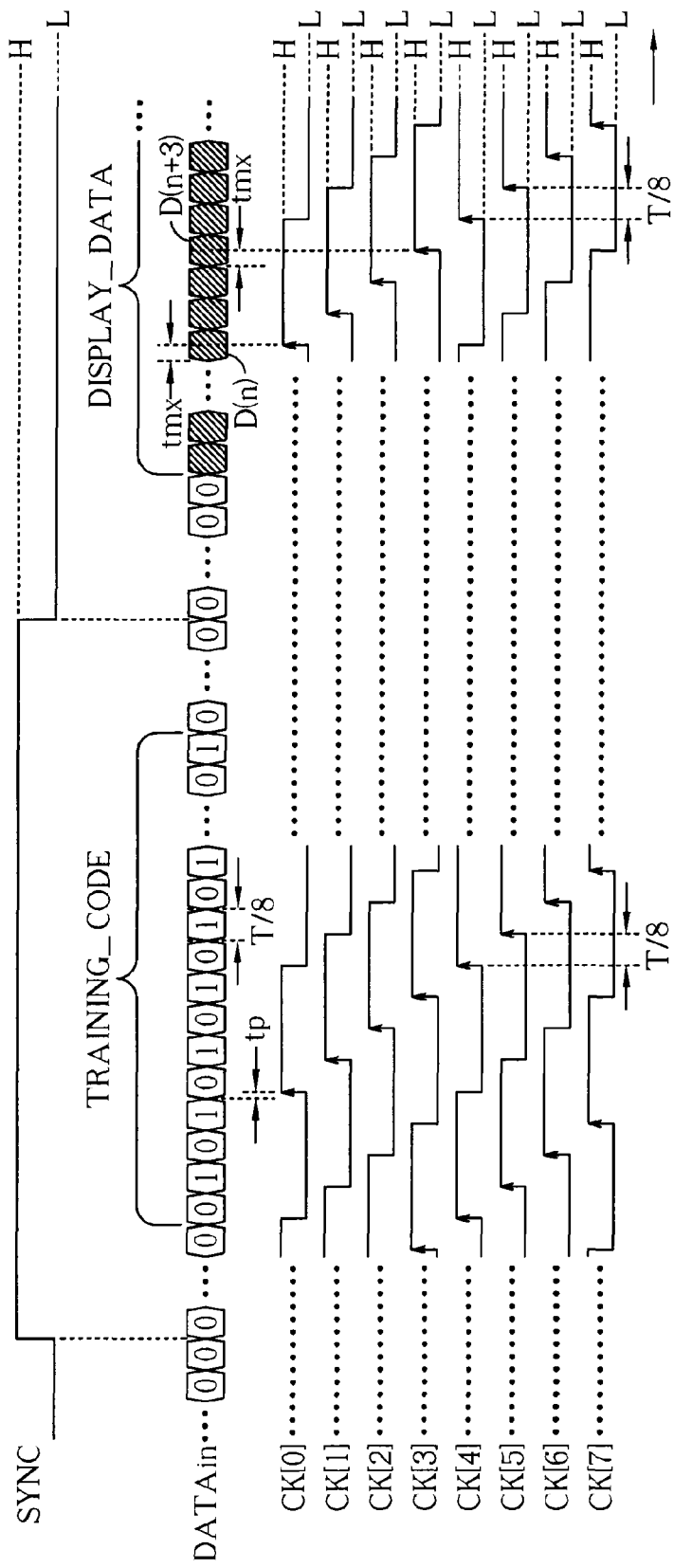
FIG. 3 is a schematic timing waveform diagram illustrating a synchronizing signal SYNC and associated signal processed in the signal circuit of FIG. 1.

FIG. 3 is a schematic timing waveform diagram illustrating a synchronizing signal SYNC and associated signal processed in the signal circuit of FIG. 1. Please refer to FIGS. 1, 2 and 3. In an embodiment, the signal circuits 10 and 10' are used in an electronic system of a display panel for processing video signals. For example, the signal circuit 10' is a time controller, and the signal circuit 10 is a source driver. The input/output data DATAin of the signal circuits 10 and 10' may be a serial video data including a plurality of frames. Each of the frames includes the training code (TRAINING_CODE) and the content data (e.g. the display data DISPLAY_DATA). In the embodiment of FIG. 3, the training code TRAINING_CODE is a bit series "0101 . . . " in a predetermined mode. The display data DISPLAY_DATA includes the hue components of respective pixels of a frame in various color channels. The training code TRAINING_CODE occurs during the time segment corresponding to the high level H of the synchronizing signal SYNC. The display data DISPLAY_DATA occurs during the time segment corresponding to the low level L of the synchronizing signal SYNC. That is, the level state of the synchronizing signal SYNC may be used to indicate the training code of the input/output data DATAin In a case that the synchronizing signal SYNC is at the high level H, the training code TRAINING_CODE of the input/output data DATAin is sampled by the sampler 24. The phase selector 26 will compare the sampling result with the training code TRAINING_CODE in the predetermined mode, thereby judging whether the input/output data DATAin may be suitably sampled according to the phases of the sampling clocks CK[0]~CK[7] (e.g. the time segment tp as shown in FIG. 3). If the input/output data DATAin fails to be sampled according to the phases of the sampling clocks CK[0]~CK[7], the value of the phase select signal PS is changed by the phase selector 26, so that the phases of respective sampling clocks are adjusted.

After the above sampling step, comparing step and phase select signal adjusting step are repeatedly done, the optimal value of the phase select signal PS may be determined by the phase selector 26. After the synchronizing signal SYNC is switched from the high level H to the low level L, the phase interpolators PI[0]~PI[7] will be always controlled by the phase selector 26 according to the optimal value of the phase select signal PS. Consequently, the sampling clocks CK[0]~CK[7] from respective phase interpolators can trigger the action of sampling the input/output data DATAin at the preferable phase and at the preferable timing. For example, after the optimized adjustment, the phase of the sampling clock may be indicated by the time segment tmx. Consequently, the timing of triggering the sampling action (e.g. the time period of switching a sampling clock from the low level L to the high level H) substantially lies in the midpoint of a corresponding bit. For example, according to the sampling clock CK[0], the timing of triggering the sampling action is equivalent to the midpoint of the bit D(n). In addition, according to the sampling clock CK[3], the timing of triggering the sampling action is equivalent to the midpoint of the bit D(n+3).

From the above description, in the conventional computing technology, the input/output data is exchanged between the signal circuits according to a high-frequency reference clock (e.g. the frequency of the reference clock is equal to the bit rate or equal to a half of the bit rate). In contrast, according to the present invention, the input/output data is exchanged according to a low-frequency reference clock. For example, the frequency of the reference clock is one-eighth of the bit rate of the input/output data. Consequently, the electromagnetic interference and power consumption resulting from the high-frequency clock will be effectively reduced, and the circuitry complexity and layout of the signal circuit will be simplified. The signal circuit of the present invention may be applied to an electronic system of a display panel. For example, the signal circuit is a PPmL (point to point mini low-voltage differential signaling) time controller and/or source driver.

In the above embodiment as shown in FIG. 1, the phase circuit 28 has an architecture of a delay-locked loop circuit for providing various phase signals PH[0]~PH[8] according to the reference clock CKref. However, the phase circuit 28 is not limited to the architecture of the delay-locked loop circuit. For example, the phase circuit 28 may be implemented by any other similar architecture (e.g. an analog and/or digital phase-locked circuit or delay-locked loop circuit) or any other multi-phase clock generator. In the above embodiment as shown in FIG. 1, the phases of the respective sampling clocks CK[0] ~CK[7] are adjusted by the clock circuit 22 according to phase interpolation. Alternatively, the clock circuit 22 may utilize other methods for adjusting the phases of the sampling clocks. For example, an adjustable time delay may be introduced into the phase signal PH[m] in order to generate the sampling clock CK[m].

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal circuit, comprising:
    a clock terminal for transmitting a reference clock; and
    a data terminal for transmitting an input/output data corresponding to the reference clock, and
    a synchronizing signal terminal for transmitting a synchronizing signal;
    wherein the frequency of the reference clock is lower than a half of a bit rate of the input/output data; the input/output data contains a training code and a content data, the training code occurs during a time segment corresponding to a first level of the synchronizing signal, the display data occurs during a time segment corresponding to a second level of the synchronizing signal, and the first level is different from the second level.

2. The signal circuit as claimed in claim 1, wherein the frequency of the reference clock is substantially equal to 1/M times the bit rate (bits per unit time) of the input/output data, wherein M is greater than 2.

3. The signal circuit as claimed in claim 1, further comprising a receiver circuit, wherein the receiver circuit comprises:

a clock circuit connected with the clock terminal for providing a plurality of sampling clock according to the reference clock, wherein the frequency of each sampling clock is equal to the frequency of the reference clock, and the plurality of sampling clocks have different phases; and
    a sampler connected to the data terminal and the clock circuit for sampling the input/output data according to the sampling clocks, thereby providing a plurality of sampling data, wherein the bit rate of each sampling data is substantially equal to the frequency of a corresponding sampling clock.

4. The signal circuit as claimed in claim 3, wherein the clock circuit comprises:
    a phase circuit for generating a plurality of phase signal according to the reference clock, wherein the frequency of each phase signal is equal to the frequency of the reference clock, and the plurality of phase signals have different phases; and
    a plurality of phase interpolators, wherein each phase interpolator receives two of the plurality of phase signals and performs a phase interpolation on the two phase signals according to a phase select signal, thereby generating one of the plurality of sampling clocks.

5. The signal circuit as claimed in claim 4, wherein the receiver circuit further comprises a phase selector, which is connected to the sampler and the plurality of phase interpolators for providing the phase select signal according to the training code of the input/output data.

6. The signal circuit as claimed in claim 4, wherein the phase circuit comprises:
    a phase detector for comparing a phase difference between two of the phase signals, thereby generating an error signal;
    a capacitor;
    a charge pump connected between the phase detector and the capacitor for generating a control voltage according to the error signal; and
    a voltage-controlled delay line connected to the charge pump and the clock terminal for generating the plurality of phase signals according to the control signal and the reference clock.

7. The signal circuit as claimed in claim 1, wherein the input/output data is a video data including a plurality of frames, wherein the training code and the content data are included in each frame.

* * * * *